(12) United States Patent
Chang

(10) Patent No.: US 12,087,729 B2
(45) Date of Patent: *Sep. 10, 2024

(54) MULTI-CHIP PACKAGE HAVING STRESS RELIEF STRUCTURE

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 115 days.

This patent is subject to a terminal disclaimer.

(21) Appl. No.: 17/406,097

(22) Filed: Aug. 19, 2021

(65) Prior Publication Data

US 2022/0352119 A1 Nov. 3, 2022

Related U.S. Application Data

(60) Provisional application No. 63/182,724, filed on Apr. 30, 2021.

(51) Int. Cl.
*H01L 25/065* (2023.01)
*H01L 21/56* (2006.01)
(Continued)

(52) U.S. Cl.
CPC .......... *H01L 25/0652* (2013.01); *H01L 21/56* (2013.01); *H01L 23/20* (2013.01);
(Continued)

(58) Field of Classification Search
CPC . H01L 2224/08145; H01L 2224/16145; H01L 2224/16227; H01L 2224/17181;
(Continued)

(56) References Cited

U.S. PATENT DOCUMENTS 8,947,931 B1 * 2/2015 D'Abreu ............. H01L 25/0652
365/185.11
10,319,699 B2 * 6/2019 Wei .......................... H01L 24/03
(Continued)

OTHER PUBLICATIONS

Claims filed 6/10/202 of co-pending U.S. Appl. No. 17/700,447 (Year: 2022).*

*Primary Examiner* — Telly D Green
(74) *Attorney, Agent, or Firm* — Kilpatrick Townsend & Stockton LLP

(57) ABSTRACT

A semiconductor device includes a package substrate, and a first die group bonded onto the package substrate. The first die group characterized by a first thickness. The semiconductor device also has a second die group bonded onto the package substrate. The second die group characterized by a second thickness. The semiconductor device further includes a carrier substrate disposed on the first die group. The carrier substrate is characterized by a third thickness that is a function of a difference between the first thickness and the second thickness. A molding compound material is disposed on the package substrate and covers the first die group and the second die group. The molding compound material includes a cavity between the first die group and the second die group.

20 Claims, 13 Drawing Sheets

(51) Int. Cl.
*H01L 23/00* (2006.01)
*H01L 23/20* (2006.01)
*H01L 23/24* (2006.01)
*H01L 23/31* (2006.01)
*H01L 25/00* (2006.01)

(52) U.S. Cl.
CPC .......... *H01L 23/24* (2013.01); *H01L 23/3135* (2013.01); *H01L 23/315* (2013.01); *H01L 25/50* (2013.01); *H01L 24/08* (2013.01); *H01L 24/16* (2013.01); *H01L 24/32* (2013.01); *H01L 24/33* (2013.01); *H01L 2224/08145* (2013.01); *H01L 2224/16145* (2013.01); *H01L 2224/32145* (2013.01); *H01L 2224/32225* (2013.01); *H01L 2224/33181* (2013.01)

(58) Field of Classification Search
CPC . H01L 2224/80895; H01L 2224/80896; H01L 2224/94; H01L 2225/06513; H01L 2225/06541; H01L 24/08; H01L 24/80; H01L 25/0652; H01L 25/0657; H01L 25/50; H01L 21/56; H01L 2224/0401; H01L 2224/0557; H01L 2224/06181; H01L 2224/08225; H01L 2224/131; H01L 2224/13147; H01L 2224/1703; H01L 2224/32145; H01L 2224/32225; H01L 2224/33181; H01L 2224/73251; H01L 2224/80001; H01L 2224/80203; H01L 2224/80805; H01L 2224/81191; H01L 2224/81193; H01L 2224/95; H01L 2225/06517; H01L 2225/06524; H01L 2225/06565; H01L 2225/06589; H01L 23/16; H01L 23/20; H01L 23/24; H01L 23/3121; H01L 23/3135; H01L 23/315; H01L 23/562; H01L 23/585; H01L 24/13; H01L 24/16; H01L 24/17; H01L 24/32; H01L 24/33; H01L 24/73; H01L 25/03; H01L 25/0655; H01L 25/18; H01L 2924/00014; H01L 2924/10158; H01L 2924/15192; H01L 2924/181; H01L 2924/3511; H01L 2924/3512; H01L 21/486; H01L 2224/08; H01L 2224/08146; H01L 2224/09181; H01L 2224/16; H01L 2225/1035; H01L 2225/107; H01L 23/12; H01L 23/31; H01L 23/642; H01L 25/071; H01L 25/105; H01L 25/16; H01L 28/90; H01L 2924/00012; H01L 2924/014
See application file for complete search history.

(56) References Cited

U.S. PATENT DOCUMENTS

| | | | |
|---|---|---|---|
| 10,770,430 B1* | 9/2020 | Kim | H01L 25/50 |
| 2009/0079060 A1* | 3/2009 | Bartley | H01L 25/0657 257/E21.705 |
| 2010/0178732 A1* | 7/2010 | Wu | H01L 25/16 257/E21.705 |
| 2012/0013022 A1* | 1/2012 | Sabuncuoglu Tezcan | H01L 23/481 257/774 |
| 2014/0363120 A1* | 12/2014 | Stephens | G02B 6/125 385/14 |
| 2015/0235936 A1* | 8/2015 | Yu | H01L 23/36 257/737 |
| 2018/0006006 A1* | 1/2018 | Kim | H01L 25/50 |
| 2018/0254260 A1* | 9/2018 | Wei | H01L 25/0652 |
| 2019/0244946 A1* | 8/2019 | Kim | H01L 23/552 |
| 2019/0259743 A1* | 8/2019 | Han | H01L 25/0657 |
| 2020/0335479 A1* | 10/2020 | Li | H01L 21/6836 |
| 2020/0343218 A1* | 10/2020 | Hu | H01L 24/80 |
| 2021/0005630 A1* | 1/2021 | Hurwitz | H01L 21/76243 |
| 2021/0119606 A1* | 4/2021 | Lu | H03H 9/02842 |
| 2021/0143126 A1* | 5/2021 | Choi | H01L 25/0652 |
| 2022/0310470 A1* | 9/2022 | Chen | H01L 27/0688 |
| 2022/0310570 A1* | 9/2022 | Chang | H01L 25/105 |

* cited by examiner

MULTI-CHIP PACKAGE HAVING STRESS RELIEF STRUCTURE

CROSS-REFERENCES TO RELATED APPLICATIONS

The present application claims priority to U.S. Provisional Patent Application 63/182,724, filed on Apr. 30, 2021, and entitled "SOIC CARRY WAFER EMBED STRESS RELEASE STRUCTURE," the entire disclosure of which is incorporated herein by reference.

TECHNICAL FIELD

The present disclosure relates to stress relief structures for reducing thermal stress in a semiconductor device package, and methods of forming the same.

BACKGROUND

Semiconductor dies can be electrically connected with other circuitry in a package substrate. The package substrate provides for electrical connection to other circuitry on a printed circuit board. Semiconductor dies can have different functions and are difficult to be processed using same semiconductor processing techniques, so they are manufactured separately. A large multi-functional device having high performance can be obtained by assembling multiple dies into the device. The multiple dies can be stacked together to form die groups, and the die groups can be mounted to the package substrate. Different die groups and the package substrate have different coefficients of thermal expansion (CTEs). For example, a silicon substrate in a device die may have a CTE of 2.5 ppm/° C., a dielectric layer may have a CTE between about 0.5 ppm/° C. to about 8 ppm/° C., while the package substrate may have a CTE of about 18 ppm/° C. The significantly different CTEs may cause warpage in the package substrate at high temperatures, e.g., in a solder reflow or during operation. The warpage in the package substrate can cause die and/or bump cracks and material delamination.

BRIEF DESCRIPTION OF THE DRAWINGS

The present disclosure is best understood from the following detailed description when read with the accompanying figures. It is noted that, in accordance with the standard practice in the industry, various features are not drawn to scale. In fact, the dimensions of the various features may be arbitrary increased or reduced for clarity of discussion.

DETAILED DESCRIPTION

Figure 1:
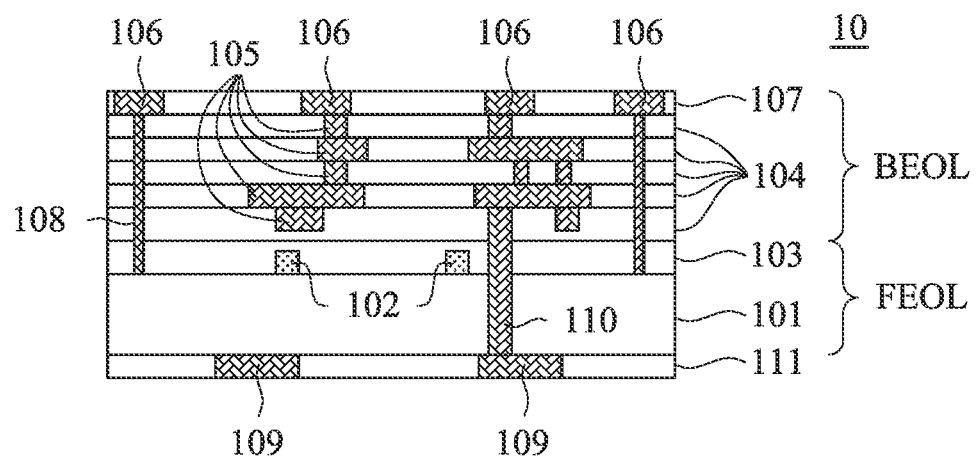
FIG. 1 is a simplified cross-sectional view of a die according to some exemplary embodiments.

The following disclosure provides many different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Prepositions, such as "on" and "side" (as in "sidewall") are defined with respect to the conventional plane or surface being on the top surface of the wafer or substrate, regardless of the orientation of the wafer or substrate. The term "horizontal" is defined as a plane parallel to the conventional plane or surface of a wafer or substrate, regardless of the orientation of the water or substrate. The term "vertical" refers to a direction perpendicular to the horizontal as defined above, i.e., perpendicular to the surface of a substrate. The terms "first," "second," "third," and "fourth" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Multiple die groups are packaged into a common package substrate to form a package device. The package substrate includes electrically conductive wires to electrically connect the die groups. The multiple die groups may be bonded onto one side of the package substrate using flip-chip bonding, and a reflow is performed to melt the solder balls that interconnect the die groups and the package substrate. As discussed above, different die groups and the package substrate can have different CTEs. The CTE mismatch can cause warpage of the die groups, thereby leading to cracks and delamination of dies in a die group, and adversely affecting the yield and performance of the package device. In some embodiments, a subsequent encapsulating molding process of forming an encapsulation layer over the die groups can worsen the warpage of the dies in the die groups, as the encapsulation layer and the dies in the die groups have different CTEs.

Numerous benefits and advantages are achieved by way of the present disclosure over conventional techniques. For example, embodiments provide stress relief structures for reducing thermal stress in a packaged semiconductor device. Embodiments overcome problems associated with warpage in a package substrate and die groups bonded on the package substrate, and in particularly, cracks and delamination in stacked dies due to significantly different coefficients of thermal expansion (CTEs) of the dies and the package substrate. Embodiments of the present disclosure have advantageous stress relief features or structures. For example, by attaching a carrier substrate to an upper surface of a die group, it is possible to reduce stress caused by the encapsulating layer. In some embodiments, the stress reduction effect can be further improved when an air gap is embedded in the carrier substrate.

In some embodiments, the carrier substrate is fusion bonded to an upper surface of a die group. An advantage of the fusion bonding is that no additional layer (e.g., adhesive layer) is formed between the carrier substrate and the upper surface of the die group. In some embodiments, the carrier substrate includes one or more air gaps to improve stress relieving capabilities. The one or more air gaps can be formed in the carrier substrate using existing CMOS process technologies.

In some embodiments, the stress relief features includes a cavity in the encapsulation layer, where the cavity is disposed between two adjacent die groups. The cavity can further reduce stresses in the package device. In some embodiments, a method includes providing a first die group and a second die group, determining a height difference between the first die group and the second die group, and providing a carrier substrate in response to the determined height difference. The method also includes thinning the carrier substrate based on the height difference to obtain a thinned carrier substrate, and mounting the thinned carrier substrate to the first die group to form a height-adjusted first die group having a height within a height range of the second die group. In an embodiment, the carrier substrate is substantially free of electronic devices. These and other embodiments of the disclosure, along with many of its advantages and features, are described in more detail in conjunction with the text below and corresponding figures.

Exemplary embodiments described herein relate to multi-chip devices having vertically stacked chips mounted on a base substrate or a package substrate. As used herein, chips and dies are used interchangeably and refer to pieces of a semiconductor wafer, to which a semiconductor manufacturing process has been performed, formed by separating the semiconductor wafer into individual dies. A chip or die can include a processed semiconductor circuit having a same hardware layout or different hardware layouts, same functions or different functions. In general, a chip or dies has a substrate, a plurality of metal lines, a plurality of dielectric layers interposed between the metal lines, a plurality of vias electrically connecting the metal lines, and active and/or passive devices. The dies can be assembled together to be a multi-chip device or a die group. As used herein, a chip or die can also refer to an integrated circuit including a circuit configured to process and/or store data. Examples of a chip, die, or integrated circuit include a field programmable gate array (e.g., FPGA), a processing unit, e.g., a graphics processing unit (GPU) or a central processing unit (CPU), an application specific integrated circuit (ASIC), memory devices (e.g., memory controller, memory), and the like.

FIG. 1 is a simplified cross-sectional view of a die 10 according to some exemplary embodiments. Referring to FIG. 1, the die 10 includes a front-end-of-line (FEOL) representing a first portion of the fabrication of an integrated circuit (die), where individual devices (e.g., transistors, capacitors, diodes, resistors, inductors, and the like) 102 are formed in and on a substrate 101. The substrate 101 can be a semiconductor substrate or a non-semiconductor substrate. For example, the substrate 101 may include a bulk silicon substrate. In some embodiments, the substrate 101 may include an elementary semiconductor, such as silicon or germanium in a crystalline structure, a compound semiconductor, e.g., silicon germanium, silicon carbide, gallium arsenic, gallium phosphide, indium phosphide, indium arsenide, and/or indium antimonide, or combinations thereof. Possible substrate 101 may also include a semiconductor-on-insulator (SOI) substrate. In an embodiment, the substrate 101 is a silicon layer of an SOI substrate. The substrate 101 can include various doped regions depending on design requirements, e.g., n-type wells or p-type wells. The doped regions are doped with p-type dopants, e.g., boron, n-type dopants, e.g., phosphorous or arsenic, or combination thereof.

An FEOL may include defining active regions in upper surface portions of the semiconductor substrate 101, forming trench isolation structures isolating the individual devices, performing implants for forming wells, forming gate structures and source and drain regions, and forming an interlayer dielectric layer (ILD) 103 on the semiconductor substrate 101 and active devices 102. The die 10 also includes a back-end-of-line (BEOL) representing a second portion of the fabrication of the die after the FEOL. A BEOL includes forming metal and via patterns based on positions of the formed individual devices. For example, a plurality of intermetal dielectric layers (IMB) 104 are formed on the interlayer dielectric layer 103, with a plurality of patterned metal lines and vias subsequently formed in the IMD layers 104. The interlayer dielectric layers (IMD) each may include a dielectric or insulating material. Examples of suitable dielectric materials include silicon oxide, doped silicon oxide, various low-k dielectric and high-k dielectric materials known in the art, and combination thereof. The IMD layers 104 may be formed by conventional techniques, such as, chemical vapor deposition (CVD), plasma enhanced CVD (PECVD), physical vapor deposition (PVD), or by other deposition methods. Metal lines and vias 105 are formed in the IMD layers 104 to provide an electrical connection to devices 102. In an embodiment, the metal lines and vias 105 may include copper, aluminum, nickel, tungsten, cobalt, or alloys thereof.

In an embodiment, the die 10 also includes metal pads 106 on the IMD layers 104 and a passivation layer 107 having a dielectric material that electrically isolates the metal pads 106. In an embodiment, the die 10 further includes a seal ring 108 that surrounds the die 10 and extends from a metal pad 106 through the IMD layers 104 and ILD layer 103 to a surface of the substrate 101. The seal ring 108 is configured to prevent moisture, water, and other pollutant from entering the die. In an embodiment, the die 10 also includes a plurality of contact pads 109 on the bottom surface of the substrate 101, the contact pads are electrically connected to the metal lines and vias 105 through one or more through-substrate vias 110. The die 10 also includes a dielectric layer 111 containing one or more bond pads disposed on the bottom surface of the substrate 101.

Figure 2:
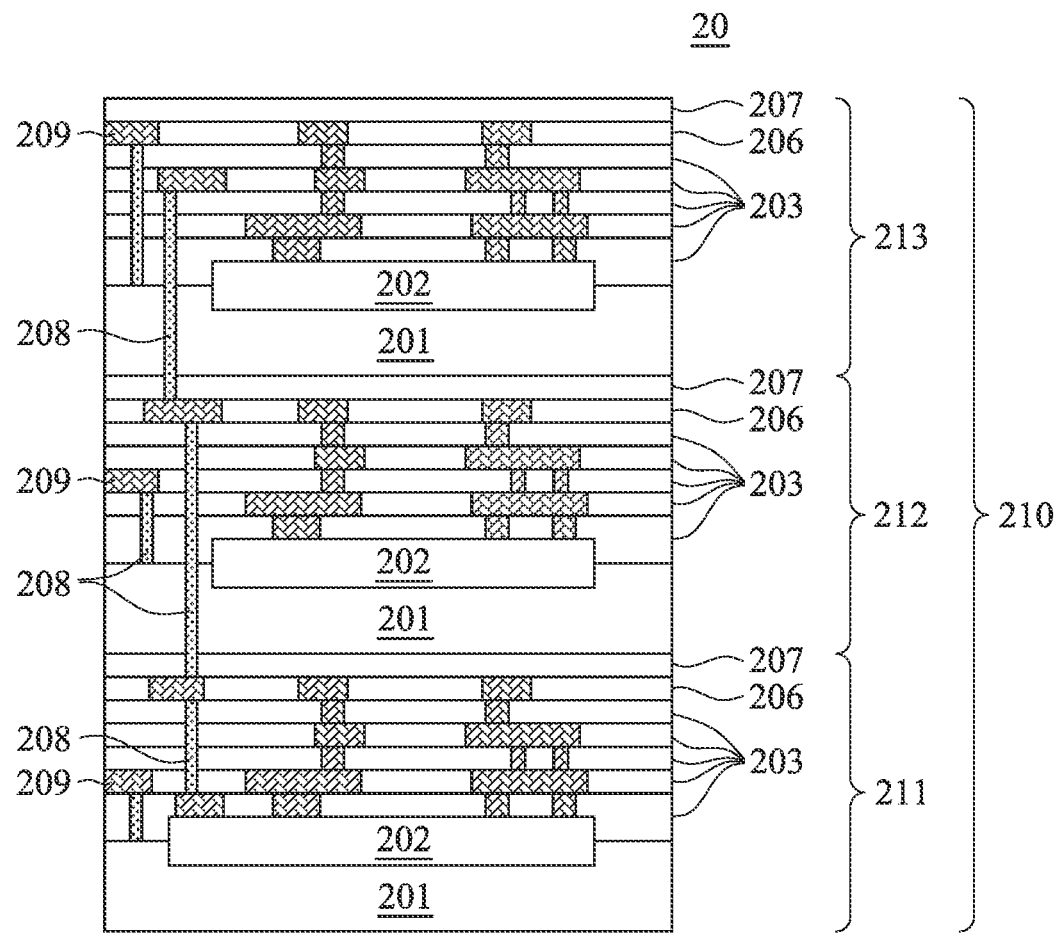
FIG. 2 is a cross-sectional view of a die group 20 having a plurality of dies stacked with each other according to some exemplary embodiments.

FIG. 2 is a simplified cross-sectional view of a die group 20 having a plurality of dies stacked with each other according to some exemplary embodiments. Referring to FIG. 2, The die group 20 includes a stacked die structure 210 having a plurality of dies 211, 212, and 213 stacked on top of each other in a substantially horizontal arrangement. In an embodiment, each of the dies can be a semiconductor device similar to the die 10 of FIG. 1. For example, each of the stacked dies 211, 212, and 213 includes a substrate 201, an active region 202 formed on a surface of the substrate 201, a plurality of dielectric layers 203, a plurality of metal lines and a plurality of vias 204 formed in the dielectric layers 203, and a passivation layer 207 on a top intermetal layer 206. In an embodiment, a stacked die can also include passive devices, such as resistors, capacitors, diodes, inductors, and the like. In an embodiment, the stacked dies are bonded to one another at a bonding surface of a passivation layer 207 by fusion bonding. In an embodiment, one or more bond pads are embedded in the passivation layer 207 of the die 211, and a dielectric layer containing one or more bond pads is disposed on the lower surface of the die 212, such that the dies 211 and 212 are hybrid bonded between the passivation layer on the upper surface of the die 211 and the dielectric layer on the lower surface of the die 212.

The substrate 201 can be a semiconductor substrate or a non-semiconductor substrate. For example, the substrate 201 may include a bulk silicon substrate. In some embodiments, the substrate 201 may include an elementary semiconductor, such as silicon or germanium in a crystalline structure, a compound semiconductor, e.g., silicon germanium, silicon carbide, gallium arsenic, gallium phosphide, indium phosphide, indium arsenide, or combinations thereof. Possible substrate 201 may also include a semiconductor-on-insulator (SOI) substrate. In an embodiment, the substrate 201 is a silicon layer of an SOI substrate. The substrate 201 can include various doped regions depending on design requirements, e.g., n-type wells or p-type wells. The doped regions are doped with p-type dopants, e.g., boron, n-type dopants, e.g., phosphorous or arsenic, or combination thereof. The active region 202 may include transistors. The dielectric layers 203 may include interlayer dielectric (ILD) and intermetal dielectric (IMD) layers. The ILD and IMD layers may be low-k dielectric layers which have dielectric constants (k values) smaller than a predetermined value, e.g., about 3.9, smaller than about 3.0, smaller than 2.5 in some other embodiments. In some other embodiments, the dielectric layers 203 may include non-low-k dielectric materials having dielectric constants equal to or greater than 3.9. The metal lines and vias may include copper, aluminum, nickel, tungsten, or alloys thereof.

The die group 20 may also include one or more through silicon vias (TSVs) or through oxide vias (TOVs) 208 configured to electrically connect one or more of the metal lines in the stacked dies 211, 212, and 213 with each other. The one or more through silicon vias or through oxide vias 208 may include copper, aluminum, tungsten, or alloys thereof. In some embodiments, each of the stacked dies 211, 212, and 213 may also include a side metal interconnect structure 209 on a sidewall of the stack dies. The side metal interconnect structure 209 may include one or more metal wirings extending through an exposed surface of the plurality of dielectric layers 203. The side metal interconnect structure 209 may be formed at the same time as the metal layers and exposed to the side surface of the die group 20 after the different dies 211, 212, and 213 have been bonded together and the side surface is polished by a chemical mechanical polishing (CMP) process.

In some embodiments, the die group 20 can be formed by bonding a plurality of wafers together using fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In an eutectic bonding process, two eutectic materials are placed together, and are applied with a specific pressure and temperature to melt the eutectic materials. In the metal-to-metal bonding process, two metal pads are placed together, a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, each wafer may include a plurality of dies, such as semiconductor devices of FIG. 1. The bonded wafers contain a plurality of die groups having a plurality of stacked dies. The bonded wafers are singulated by mechanical sawing, laser cutting, plasma etching, and the like to separate into individual die groups that can be the die group 20 as shown in FIG. 2.

Figure 3A:
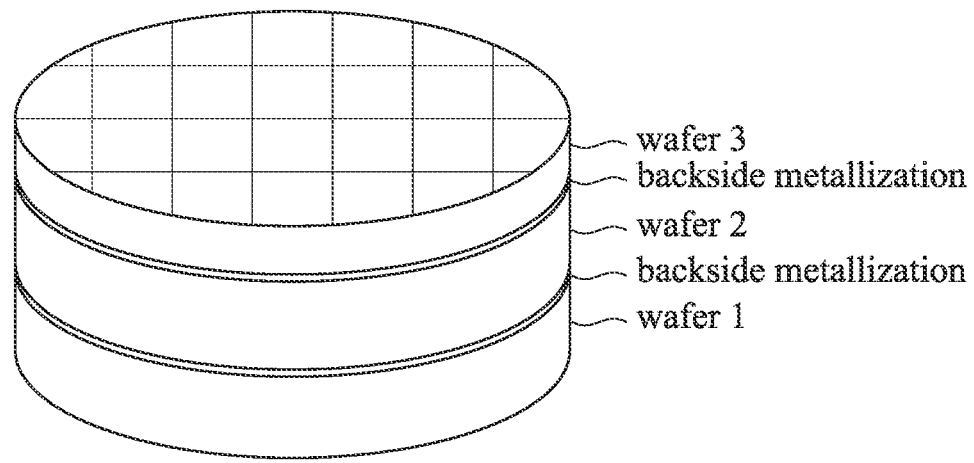
FIG. 3A is a simplified perspective view illustrating a plurality of wafers stacked on top of each other in a three-dimensional (3D) configuration according to some embodiments.

FIG. 3A is a simplified perspective view illustrating a plurality of wafers stacked on top of each other in a three-dimensional (3D) configuration according to some embodiments. Referring to FIG. 3A, in an exemplary embodiment, a first wafer "wafer 1" is a base wafer on which a plurality of dies can be formed. A second wafer "wafer 2" is an intermediate wafer on which a plurality of dies can be formed, and a third wafer "wafer 3" is a top wafer on which a plurality of dies can be formed. The wafers may have through substrate vias (TSVs) and/or through oxide vias (TOVs) and backside bonding layer (e.g., metallization layer and/or dielectric layer) and are bonded together to form a 3D stacked wafer configuration using any known bonding techniques, e.g., fusion bonding, eutectic bonding, metal bonding, hybrid bonding, and the like. The three wafers (wafer 1, wafer 2, and wafer 3) are electrically connected to each other through substrate vias, through oxide vias, and/or backside metallization layer and dielectric layer. The wafers each can have different dies. For example, wafer 1 may include dies of central processing units, graphics processing units, and logic; wafer 2 may include dies of memory devices and memory controllers; and wafer 3 may include dies of bus interfaces, input/output ports, and communication and networking devices. In the example shown in FIG. 3A, three wafers are used, but it is understood that the number is illustrative only and is chosen for describing the example embodiment and should not be limiting. In some embodiments, a passivation layer is formed on the upper surface of each of the wafers and includes a thickness to provide separation between the substrate and the metallization layer. In an embodiment, the passivation layer includes an oxide material.

Figure 3B:
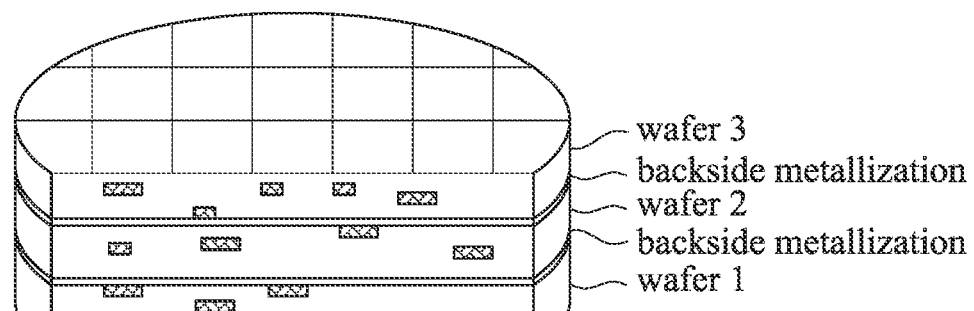
FIG. 3B is a simplified perspective view illustrating the stacked wafer configuration of FIG. 3A.
Figure 3B:
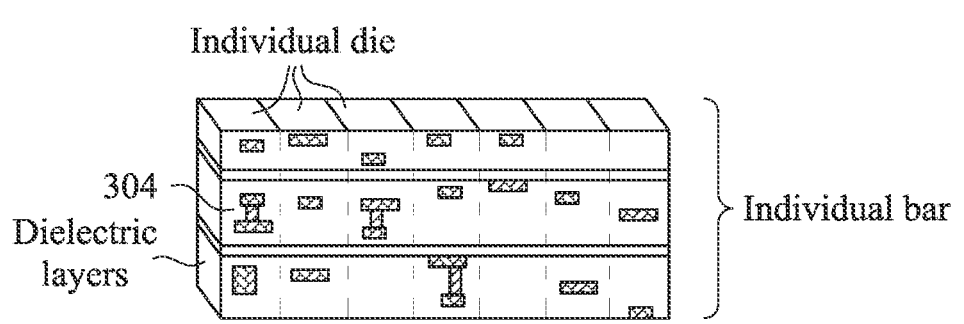

FIG. 3B is a simplified perspective view illustrating the stacked wafer configuration of FIG. 3A that has been cut and separated into individual bars according to an exemplary embodiment. For example, the stacked wafers can be cut into individual bars and individual die groups by mechanical sawing, plasma etching, laser cutting, and the like. Referring to FIG. 3B, each of the wafers include a substrate, a plurality of dielectric layers including interlayer dielectric layers (ILDs) and intermetal dielectric layers (IMDs), and a plurality of metal lines and a plurality of vias 304 formed in the dielectric layers. The dies of the stacked wafers are electrically coupled to each other through substrate vias and through oxide vias. In some embodiments, the individual bars are placed on a polishing board, and the surfaces of the bars are polished prior to being diced or singulated into dies.

Figure 3C:
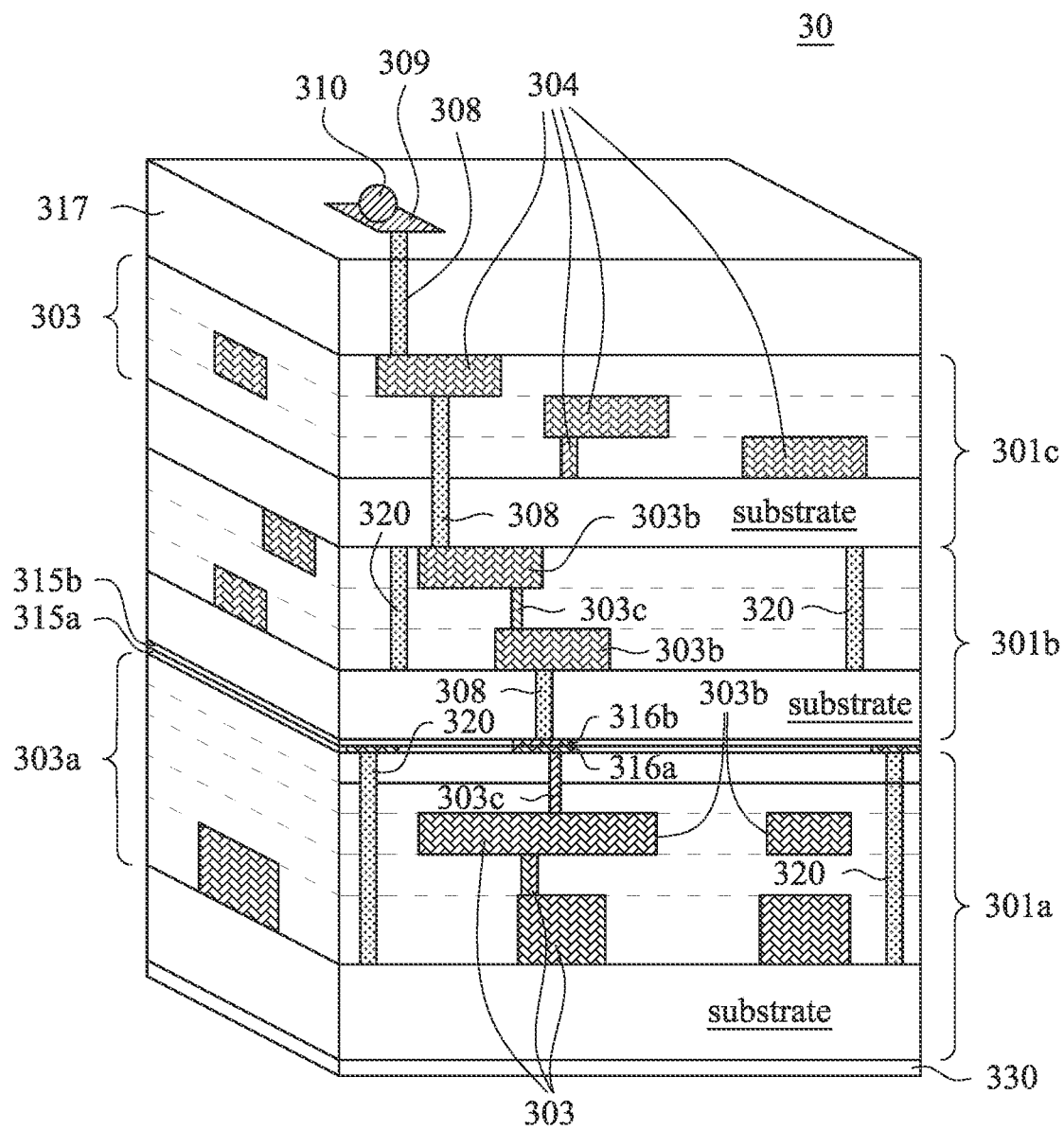
FIG. 3C is a simplified perspective view of an individual die group 30 including a plurality of stacked dies according to an exemplary embodiment.

FIG. 3C is a simplified perspective view of an individual die group 30 including a plurality of stacked dies according to an exemplary embodiment. Referring to FIG. 3C, the die group 30 includes a first die 301a, a second die 301b, and a third die 301c stacked on top of each other. Each of the first, second, and third dies may include a substrate, an active region including a plurality of active devices (not shown), an interconnect structure 303 formed on the substrate and configured to electrically connect the active region of each die with each other. The interconnect structure 303 may include a plurality of dielectric layers 303a, metal lines 303b formed in the dielectric layers 303a, and vias 303c connecting metal lines 303b in different layers. In some embodiments, the dielectric layers 303a include silicon oxide, silicon nitride, silicon carbide, silicon oxynitride, and/or combinations thereof. In some embodiments, the dielectric layers 303a may include one or more low-k dielectric layers having low k values. In some embodiments, the k values of the low-k dielectric materials may be lower than about 3.0.

In some embodiments, the dies are electrically coupled to each other by through substrate vias (TSVs) and through oxide vias (TOVs) 308. In some embodiments, the die group 30 also includes a bonding layer 317 including an oxide material, e.g., silicon oxide. In some embodiments, the bonding layer 317 may include a plurality of bonding films and electrical connectors 309 having a plurality of solder regions. In some embodiments, the electrical connectors 309 include copper posts, solder caps, and/or electrically conductive bumps 310 configured to electrically coupled to other electronic circuits on a printed circuit board or other substrates. In some embodiments, the die group 30 includes a plurality of semiconductor dies or chips similar to those of FIG. 2. In an embodiment, the stacked dies of the die group 30 include logic devices, input/output (IO) devices, processing units, e.g., data processing units, graphics processing unit, application specific integrated circuits (ASIC), field programmable gate arrays (FPGA), other applicable types of devices. In some embodiment, the die group 30 is a system-on-integrated circuits (SoIC) device that includes multiple functions. In the example shown in FIG. 3A, three dies are shown, but it is understood that the number is illustrative only and is chosen for describing the example embodiment and should not be limiting. For example, the die group 30 can include a single die, two dies, or more than three dies. In some embodiments, the die group 30 may be bonded to a package substrate (e.g., an interposer, a printed circuit board) through flip-chip bonding using the electrical connectors 309.

In some embodiments, the dies are bonded to each other by a hybrid bonding process. In an embodiment, the first die 301a has a first bonding surface formed on its upper surface including a first bonding dielectric layer 315a and a first conductive contact structure 316a. The second die 301b has a second bonding surface formed on a bottom of its substrate, the second bonding surface includes a second bonding dielectric layer 315b and a conductive contact structure 316b. In an embodiment, the first and second conductive contact structures 316a, 316b may be electrically coupled to the interconnect structure 303. In another embodiment, the first and second conductive contact structures 316a, 316b may not be electrically coupled to the interconnect structure 303. In an embodiment, the first die 301a and the second die 301b are directly hybrid bonded together, such that the first and second conductive contact structures 316a, 316b are bonded together, and the first and second bonding dielectric layers 315a, 315b are bonded together. In an embodiment, the first and second bonding dielectric layers 315a, 315b each include silicon oxide, and the first and second conductive contact structures 316a, 316b each include copper.

In an embodiment, the dies also include a seal ring 320 configured to stop cracks generated by stress during the bonding processes and/or the singulation. The seal ring 320 is also configured to prevent water, moisture, and other pollutant from entering the dies. In an embodiment, the seal ring 320 includes copper configured to suppress electromagnetic noise. In an embodiment, the first die 301a may include a bonding dielectric layer 330 configured to be bonded to a carrier substrate by fusion bonding.

Figure 4:
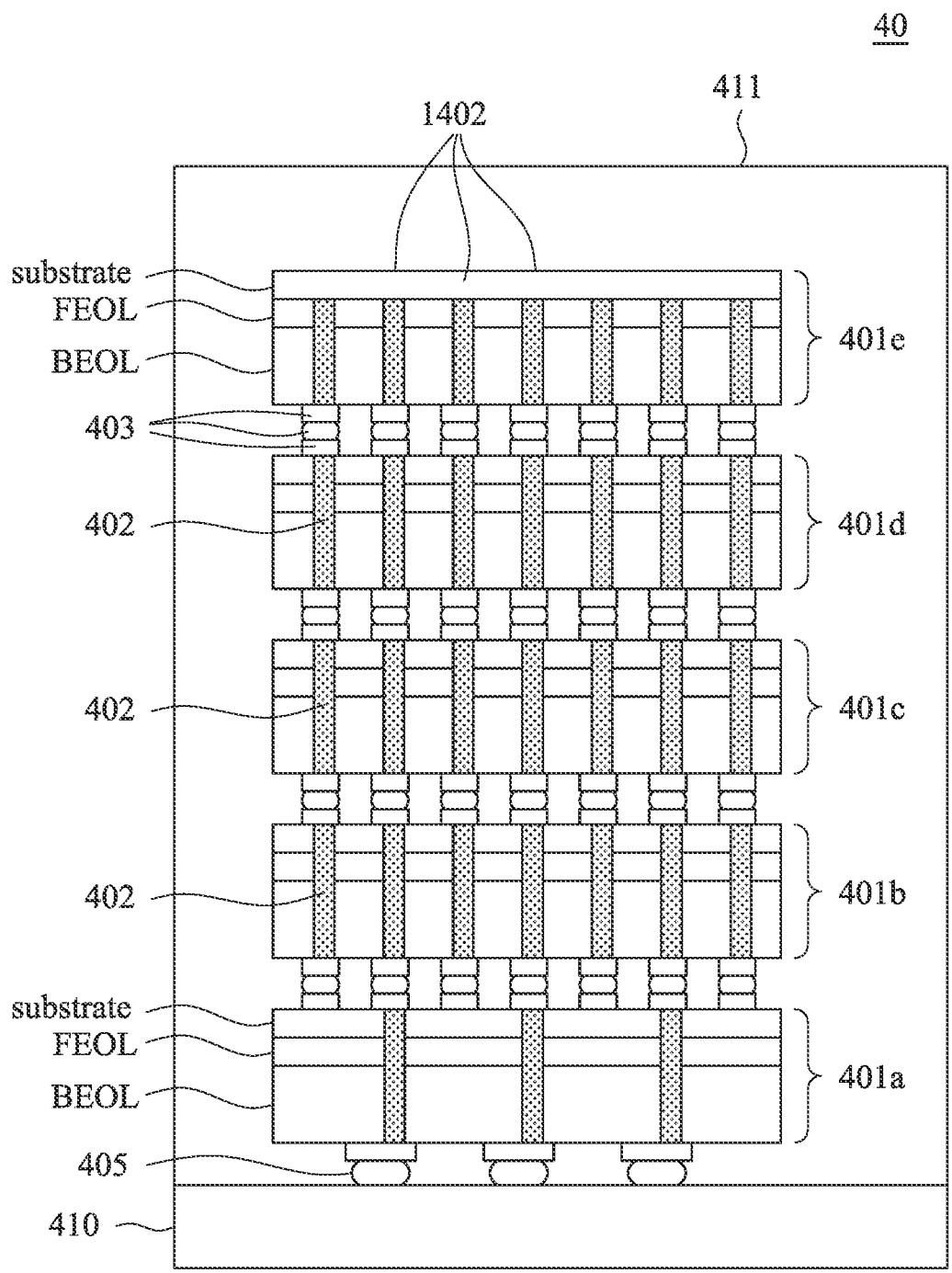
FIG. 4 is a simplified cross-sectional view of a die group 40 including a plurality of stacked dies according to an exemplary embodiment.

FIG. 4 is a simplified cross-sectional view of a die group 40 including a plurality of stacked dies according to an exemplary embodiment. Referring to FIG. 4, the die group 40 includes a plurality of dies that are stacked on top of each other. In an exemplary embodiment, the die group 40 includes dies 401a, 401b, 401c, 401d, and 401e. In an exemplary embodiment, each die includes a substrate, a front-end-of-line (FEOL) structure, and a back-end-of-line structure. The FEOL structure generally includes a first portion of a fabrication of an integrated circuit, such as forming trench isolation structures, performing implants for forming wells, forming active regions, e.g., source/drain regions, gate structures, and interlayer dielectric layers. The BEOL structure generally includes forming electrically conductive lines, vias in intermetal dielectric layers to electrically couple electronic circuits formed on the substrate. In some embodiments, the dies 401a, 401b, 401c, 401d, and 401e are memory dies. The memory dies may include memory devices, such as static random access memory (SRAM) devices, dynamic random access memory (DRAM) devices, other suitable devices, or a combination thereof. In some embodiments, the die 401a is a memory controller die that is electrically connected to the memory dies 401b, 401c, 401d, and 401e disposed thereon. In some embodiments, the die group 40 may function as a high bandwidth memory (HBM). In the example shown in FIG. 4, five dies are shown, but it is understood that the number is illustrative only and is chosen for describing the example embodiment and should not be limiting. For example, the die group 40 can include fewer or more than five dies in some embodiments.

In some embodiments, the die group 40 also includes a plurality of conductive features 402 extending through the dies 401a to 401e and electrically coupled to a plurality of conductive bonding structures 403 disposed between the dies 401a, 401b, 401c, 401d, and 401e to electrically bond them together. The conductive features 402 are configured as through-substrate vias (TSVs) to electrically connect the dies with each other. In an embodiment, the conductive bonding structures 403 include tiny solder bumps, such as controlled collapse chip connection (C4) bumps or ball grid array (BGA) bumps and pillars formed on an upper surface of a die using various process steps. In some embodiments, the die group 40 also includes a bonding structure 405 formed on a surface of the BEOL structure of the die 401a and configured to bond the die group 40 to a substrate 410. The die group 40 is flipped over and mounted on the substrate 410. In some embodiments, the die group 40 also includes a molding compound layer 411 that encapsulates the dies 401a, 401b, 401c, 401d, and 401e. The molding compound layer 411 includes an epoxy-based resin or other suitable material. In some embodiments, the molding compound layer 411 fills the air gaps between the dies 401a, 401b, 401c, 401d, and 401e and surrounds the conductive bonding structures 403 and 405.

Figure 5A:
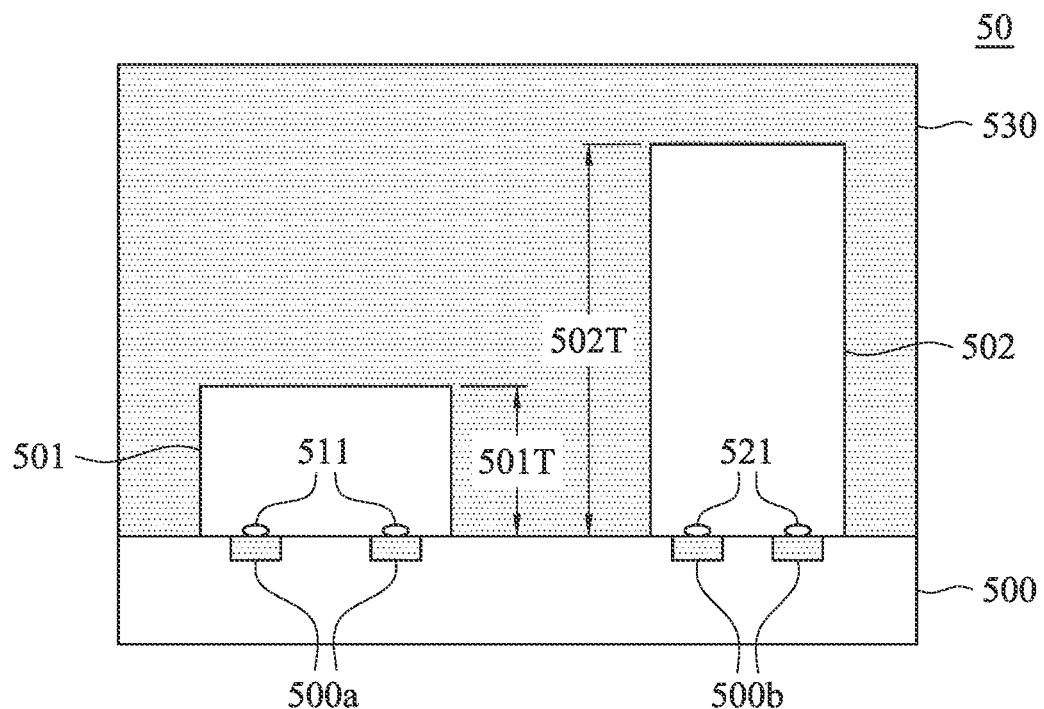
FIG. 5A is a simplified cross-sectional view of a package device according to an embodiment.

FIG. 5A is a simplified cross-sectional view of a package device 50 according to an embodiment. Referring to FIG. 5A, the package device 50 includes a package substrate 500, a first die group 501, and a second die group 502. The first die group 501 and the second die group 502 are mounted onto the package substrate 500 using a bonding process. The bonding process can include through fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In an eutectic bonding process, two eutectic materials are placed together, and are applied with a specific pressure and temperature to melt the eutectic materials. In the metal-to-metal bonding process, two metal pads are placed together, a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, the first die group 501 may include a plurality of dies stacked with other through hybrid bonding. The second die group 502 may include a plurality of dies stacked onto each other through metal-to-metal bonding. In an embodiment, the first die group 501 can be the die group 30 shown and described with reference to FIG. 3C. In an embodiment, the second die group 502 can be the die group 40 shown and described with reference to FIG. 4. The first die group 501 and the second die group 502 each have a planar upper surface. Referring to FIG. 5A, the package substrate includes a plurality of bond pads 500a, 500b, the first die group 501 is flip-chip mounted over the package substrate 500 by attaching conductive bumps 511 to the bond pads 500a, and the second die group 502 is mounted over the package substrate 500 by attaching conductive bumps 521 to the bond pads 500b. The package substrate includes a plurality of electrically conductive wires configured to electrically connect the first and second die groups.

Figure 5B:
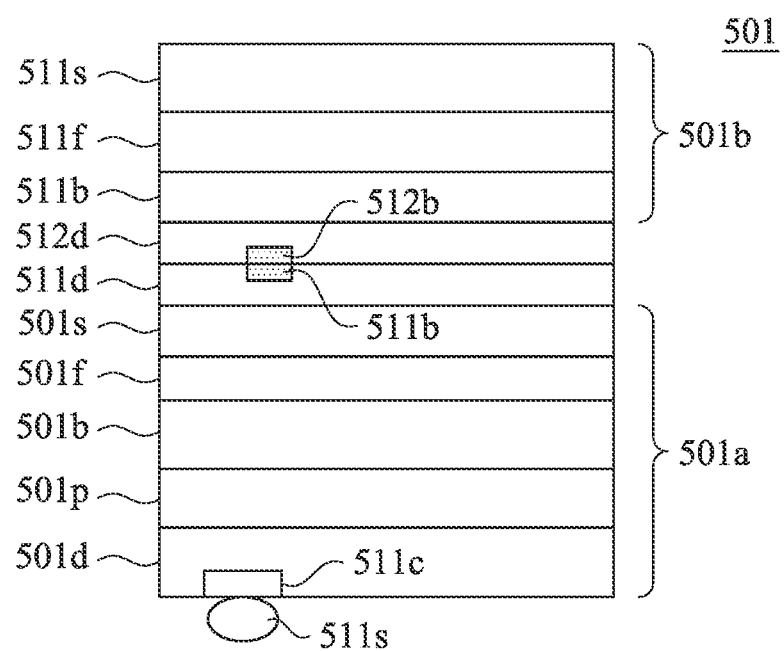
FIG. 5B is a cross sectional view of a first die group according to an embodiment.

FIG. 5B is a cross sectional view of a first die group 501 according to an embodiment. Referring to FIG. 5B, the first die group 501 includes a first die 501a having a substrate 501s, a FEOL structure 501f formed on the substrate 501s, a BEOL structure 501b formed on the FEOL structure 501f, a passivation layer 501p on the BEOL structure 511b, and a dielectric layer 511d on the passivation layer 511p. In an embodiment, the first die 511 also includes a contact pad 511c and a solder ball 511s formed on the contact pad 511c. In an embodiment, the FEOL structure 511f may include one or more dielectric layers having a suitable material, such as silicon oxide, silicon nitride, low-k dielectrics, e.g., carbon doped oxides, extremely low-k dielectrics, such as porous carbon doped silicon dioxide, the like, or a combination thereof. The BEOL structure may include one or more intermetal dielectric layers, patterned metal lines, and vias.

In an embodiment, the first die group 501 also includes a second die 501b having a substrate 511s, a FEOL structure 511f formed on the substrate 511s, a BEOL structure 511b formed on the FEOL structure 511f, a dielectric layer 512d formed on a surface of the BEOL structure 512b, and an bonding structure 512b in the dielectric layer 512d. In an embodiment, second die 501b is bonded to the first die 501b by hybrid bonding, i.e., a metal surface of the bonding structure 512b of the second die 501b is bonded to a metal surface of a bonding structure 511b in a dielectric layer 511d disposed on a lower surface of the first die 501a, and the surfaces of the dielectric layers 512d and 511d are bonded together.

Figure 5C:
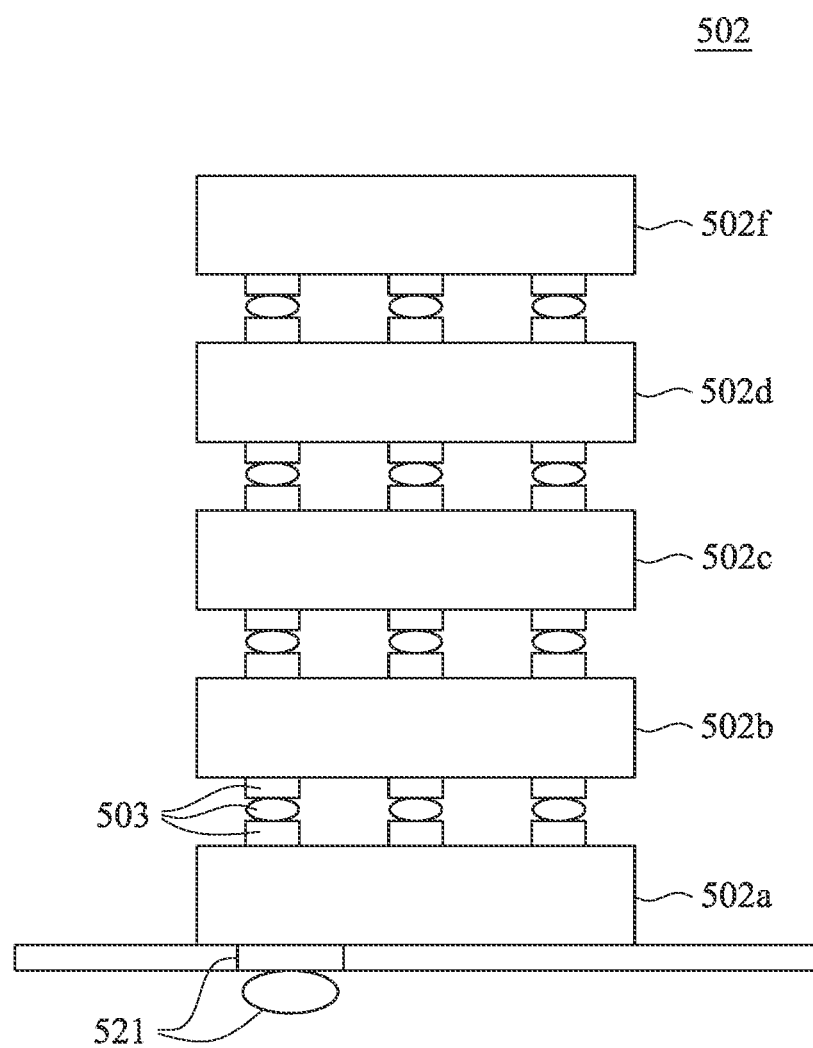
FIG. 5C is a simplified cross-sectional view of a second die group according to an embodiment.

FIG. 5C is a cross-sectional view of a second die group 502 according to an embodiment. Referring to FIG. 5C, the second die group 502 includes a plurality of dies 502a, 502b, 502c, 502d, 502e stacked on top of each other. The dies 502a, 502b, 502c, 502d, 502e are electrically connected to each other through a plurality of conductive bonding structures 503. In an embodiment, the die 401 also includes a bonding structure 521 formed on a surface of the die 401a and configured to bond the die group 502 to the substrate 500. The second die group 502 also includes a molding compound layer 511 that encapsulates the dies 501a, 501b, 501c, 501d, and 501e.

In some embodiments, the first die group 501 and the second die group 502 are bump bonded to the substrate 500. The substrate 500, the first die group 501, and the second die group 502 may have different coefficients of thermal expansion (CTEs). The different CTEs will induce thermal stress when the temperature in the package device 50 changes.

Referring to FIG. 5A, the package device 50 is subjected to a molding operation. In an exemplary molding operation, a mold compound 530 is formed over the first die group 510, the second die group 520, and the substrate 500. In a compression molding process, a liquid thermoset epoxy resin mold compound may be used in a compress molding machine, the mold compound may be heated to an elevated temperature where it becomes a lower viscous liquid, and surrounds the first die group 510 and the second die group 520 and the substrate 500. The mold compound 530 solidifies when cooled and is then released from the compress molding machine. After the mold compound 530 is cured, a grinding operation may be performed to remove a top portion of the mold compound 530. Because the CTE of epoxy does not match the CTE of silicon, when the epoxy resin mold compound is adhered to the die groups 501 and 502, the CTE mismatch introduces thermal stress on the die groups 501 and 502. In an embodiment, the mold compound 530 includes a material similar or substantially the same to the material of the molding compound layer 411. In an embodiment, the mold compound 530 is a high thermal conductivity mold compound for good heat dissipation.

In some embodiments, the first die group 501 is characterized by a first thickness (or height) 501T and a first coefficient of thermal expansion CTE1, and the second die group 502 is characterized by a second thickness (or height) 502T and a second coefficient of thermal expansion CTE2. In an embodiment, the second thickness 502T is greater than the first thickness 501T. In an embodiment, the first die group 501 may be a system-on-IC (SoIC) device, and the second die group 502 is a high-bandwidth memory (HBM)

device. In some embodiments, the first die group includes two (2) to ten (10) dies stacked with each other, and the second die group includes three (3) to fifteen (15) dies stacked to each other. The present inventor observed that, when the thickness or height difference between the first and second die groups exceeded a certain value, stress could occur in the first die group when the first and second die groups are encapsulated with a molding compound material, and a planarization process is performed on an upper surface of the molding compound material. This stress can be severe when the first die group includes hybrid bonding. The present inventor also discovered that, when a thickness difference between the first and second die groups is more than 30%, the package device 50 is susceptible to warpage and deformation that are caused by uneven stress on the upper surface of the first and second die groups.

The present subject matter thus provides a stress relief feature that can effectively reduce stress buildup on the package device 50. In one embodiment, the stress relief feature is configured to compensate for the height difference between the first and second die groups by attaching a dummy wafer (e.g., a carrier wafer or substrate) to an upper surface of the first die group. In one embodiment, the dummy wafer is attached to the upper surface of the first die group through fusion bonding.

Figure 6:
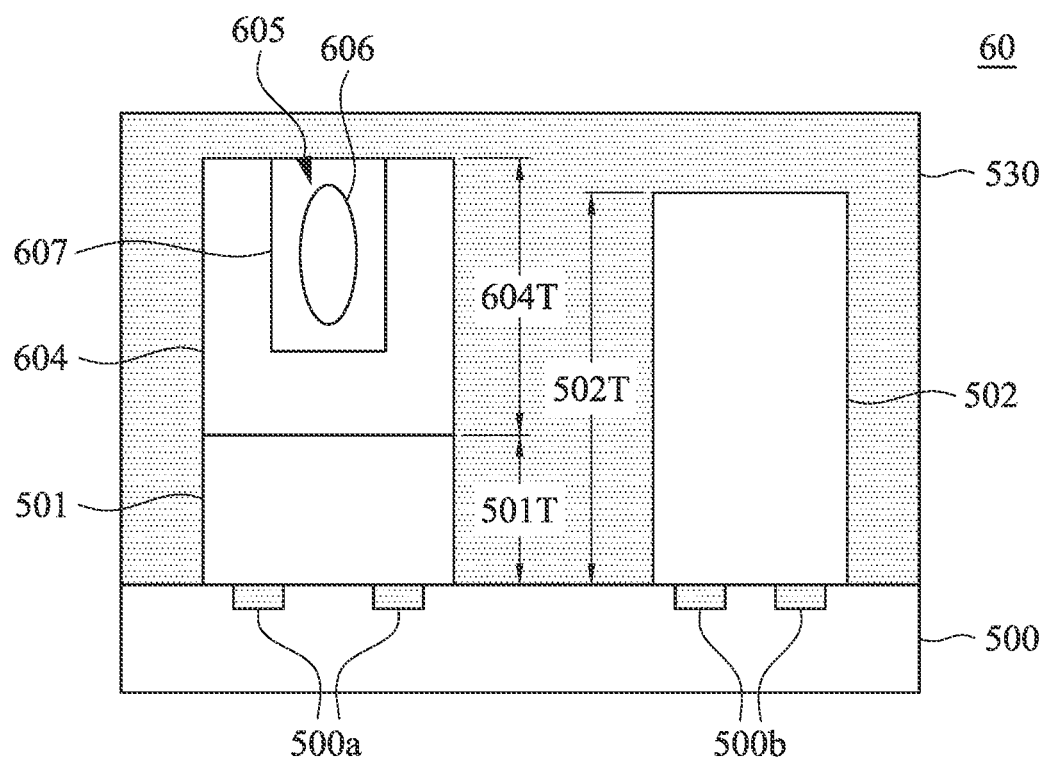
FIG. 6 is a simplified cross sectional view of a package device according to an embodiment.

FIG. 6 is a simplified cross sectional view of a package device 60 according to an embodiment. The package device 60 is similar to the package device 50 with the difference that a stress relief feature is adhered to the first die group for compensating for a height difference between the first and second die groups. Referring to FIG. 6, the package device 60 includes a stress relief feature containing a carrier substrate 604 mounted on an upper surface of the first die group 501. The carrier substrate 604 has a third thickness 604T, where a sum of the third thickness 604T and the first thickness 501T of the first die group 501 is at least equal to or greater than the second thickness 502T. In some embodiments, the sum of the third thickness 604T and the first thickness 501T is within 30% of the second thickness 501T. Furthermore, the carrier substrate 604 includes at least a trench 605 containing a dielectric material 607 and an air gap or cavity 606 encapsulated in the dielectric material 607. In some embodiments, the carrier substrate 604 can have material characteristics that are similar to the material characteristics of the first die group 501. In some embodiments, the material of the carrier substrate 604 is different from the material of the mold compound so that the mold compound does not transfer or extend stress to the first die group during the molding operation. In an embodiment, the carrier substrate 604 has a material substantially the same as the material of the substrate of the first die group 501. In an embodiment, the dielectric material 607 completely surrounds the air gap or cavity 606. In an embodiment, the dielectric material 607 includes a dielectric constant value similar to those of the dielectric layers in the FEOL or BEOL processes.

In some embodiments, the carrier substrate is a blank carrier substrate without any electronic components formed thereon. The carrier substrate may include glass, ceramic, silicon, silicon oxide, and the like, the air gap is completely encapsulated in the dielectric material to prevent residual moisture and pollutant from entering or remaining in the air gap during and after the forming process. The dielectric material can includes a low-k dielectric material. In an embodiment, the air gap includes air or a vacuum. The process of the forming the air gap will be described in detail below with reference to FIGS. 7 and 8A-8F.

In an embodiment, the lower surface of the carrier substrate is planarized to adjust the thickness 604T prior to being bonded to the upper surface of the first die group. In an embodiment, the bonding of the carrier substrate to the first die group includes fusion bonding. In an exemplary embodiment, the fusion bonding includes pressing the carrier substrate and the first die group against each other and performing an annealing process to cause the carrier substrate and the first die group to be bonded together due to atomic attraction forces. In an embodiment, the annealing process is performed at a temperature in a range from 500° C. to 1200° C.

Figure 7:
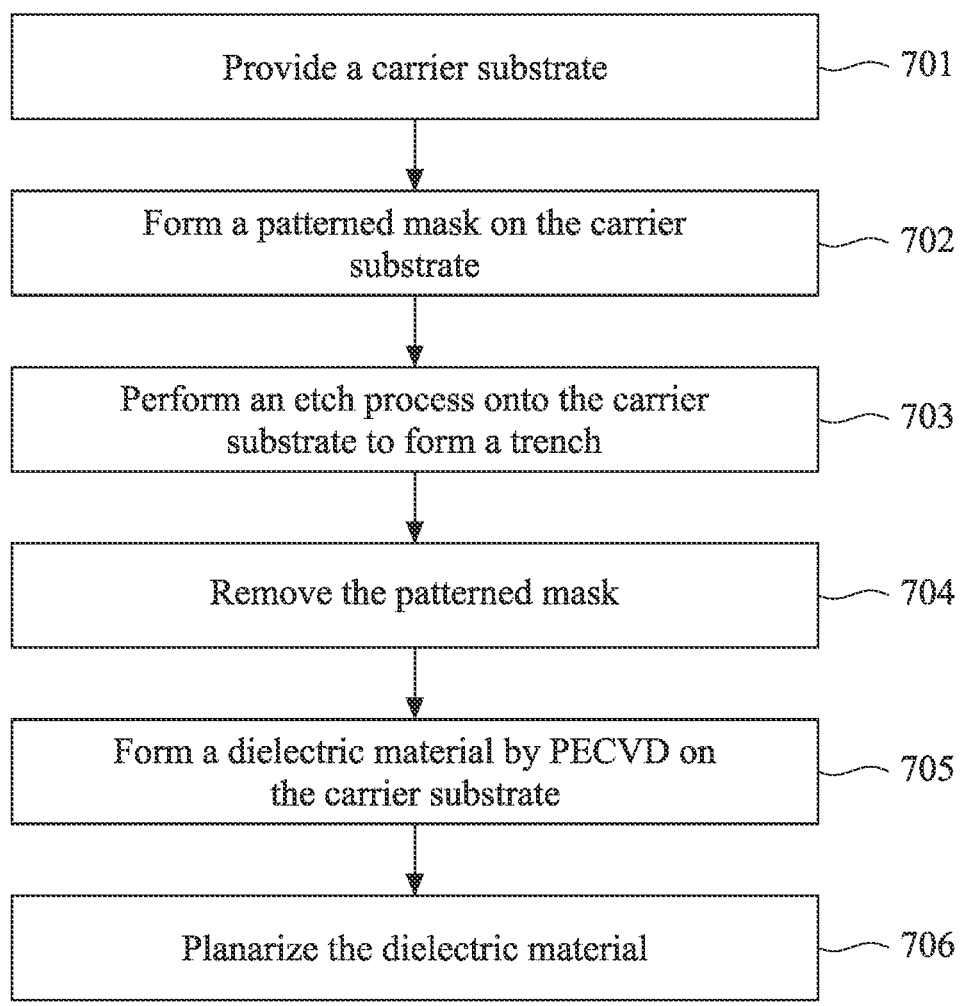
FIG. 7 is a simplified flowchart illustrating a method of fabricating a carrier substrate according to an embodiment.

FIG. 7 is a simplified flowchart illustrating a method 70 of fabricating a carrier substrate according to an embodiment. Referring to FIG. 7, the method 70 includes providing a carrier substrate having a first surface and a second surface opposite the first surface (step 701). In an embodiment, the carrier substrate can include silicon. A patterned mask is formed on the first surface and have at least one opening (step 702). The at least one opening may have an elliptical shape, a circular shape, a rectangular shape, an octagonal shape, or other polygonal shape. The patterned mask may be formed of a photoresist layer. At step 703, an etch process is performed onto the carrier substrate using the patterned mask as an etch mask to form a trench. The etch process can be a wet process, a dry process, or a combination thereof. Thereafter, the mask pattern is removed (step 704). A dielectric material is formed by plasma enhanced chemical vapor deposition (PECVD), which exhibits poor gap fill capability, i.e., PECVD has a high deposition rate at the upper corner of the trench, and a low deposition rate at the bottom of the trench, resulting in a formation of an air gap in the trench (step 705). The dielectric material can include TEOS, $SiO_2$, or the like. Thereafter, the dielectric material is planarized until an upper surface of the dielectric material is flush with the first surface of the carrier substrate (step 706).

Figure 8A:
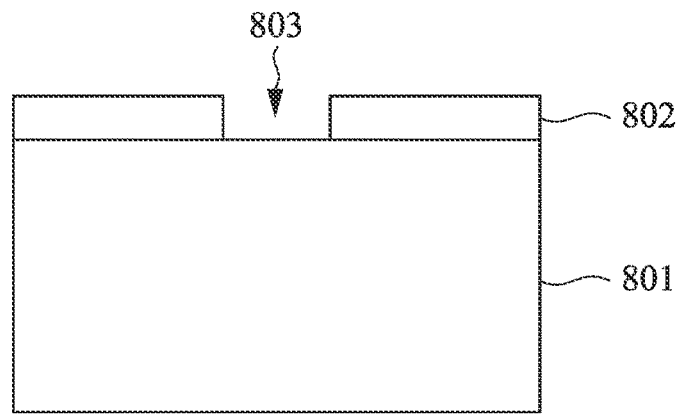
FIGS. 8A to 8F are simplified cross-sectional views illustrating intermediate stages of a method of fabricating a carrier substrate according to an embodiment.
Figure 8B:
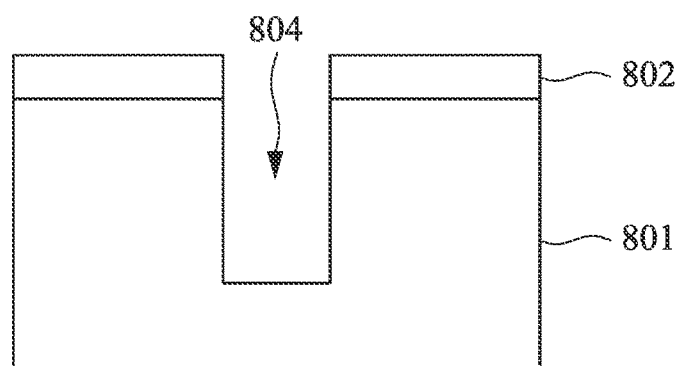
Figure 8C:
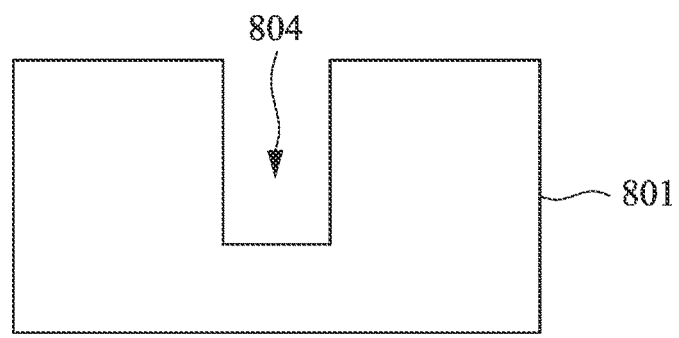
Figure 8D:
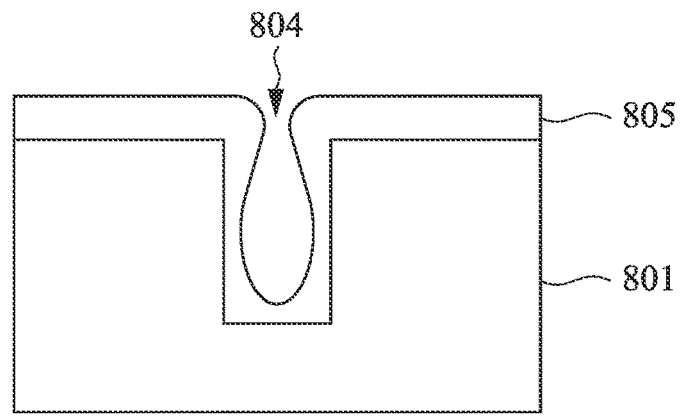
Figure 8E:
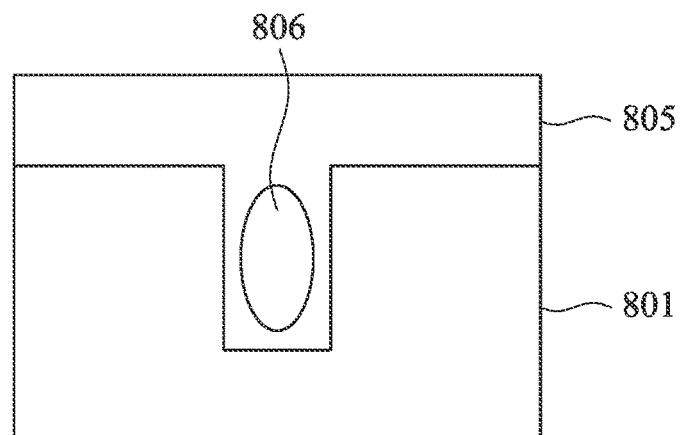
Figure 8F:
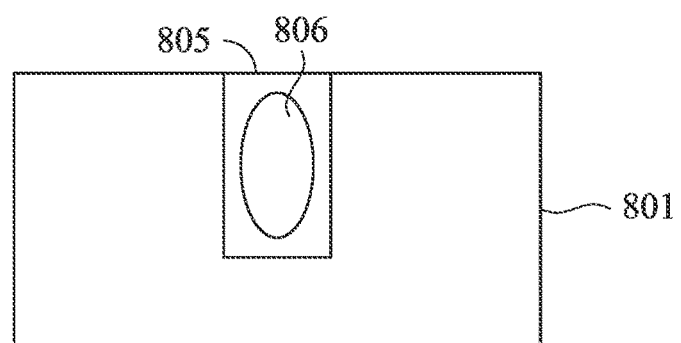

FIGS. 8A to 8F are cross-sectional views illustrating intermediate stages of a method of fabricating a carrier substrate according to an embodiment. Referring to FIG. 8A and steps 701 and 702, a carrier substrate 801 having an upper surface and a lower surface is provided, and a patterned mask 802 having at least one opening 803 is formed on the upper surface of the carrier substrate. The at least one opening 803 exposes a portion of the upper surface of the carrier substrate. Referring to FIG. 8B and step 703, a trench 804 is formed in the carrier substrate 801 by etching using the patterned mask 802 as a mask. Referring to FIG. 8C and step 704, the patterned mask 802 is removed. Referring to FIG. 8D and step 705, a dielectric material 805 is formed on the upper surface of the carrier substrate by PECVD. Due to poor gap fill capability of the PECVD process, a thicker layer of the dielectric material is formed on the upper corner of the trench narrowing the opening of the trench. The PECVD process is further continued until the dielectric material closes the opening, thereby forming an air gap 806 in the trench. The air gap 806 is completely encapsulated in the dielectric material, as shown in FIG. 8E. In an embodiment, a gas (e.g., air) can be introduced to the etch chamber filling the air gap 806. In an embodiment, air is pumped out from the etch chamber, thereby creating a vacuum or near vacuum in the air gap 806. Thereafter, referring to FIG. 8F, a planarization process, e.g., a chemical mechanical polishing (CMP), is performed on the dielectric material 805, so that an upper surface of the dielectric material 805 is flush with the first surface of the carrier substrate 801, as shown in FIG. 8F.

Figure 9:
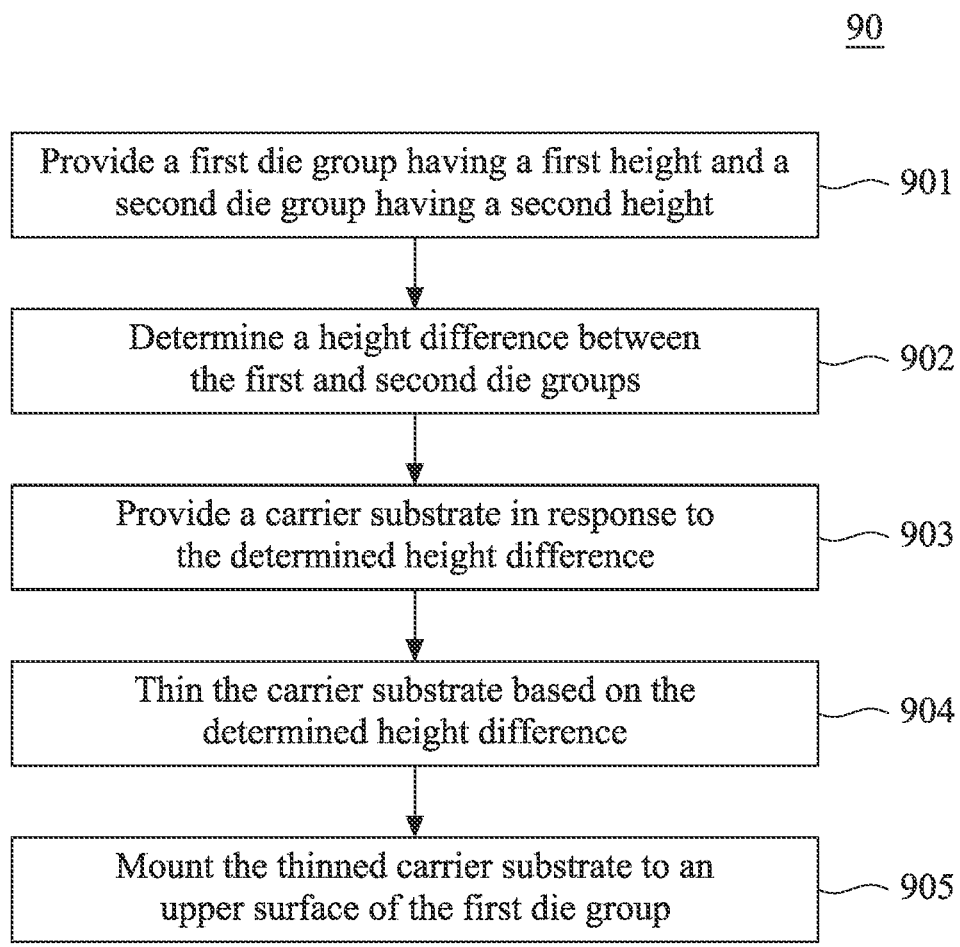
FIG. 9 is a simplified flowchart illustrating a method of adjusting a thickness of a device according to an embodiment.

FIG. 9 is a simplified flowchart illustrating a method 90 of adjusting a thickness of a device according to an embodiment. Referring to FIG. 9, the method 90 includes, at step 901, providing a first die group and a second die group, the first die group has a first height or thickness, and the second die group has a second height or thickness, the second height or thickness is greater than the first height or thickness. At step 902, the method 90 includes determining a height or thickness difference between the first and second die groups. In an embodiment, when the height difference is greater than a certain percentage of the second height of the second die group, the method 90 will take corrective action to reduce the height difference. In an exemplary embodiment, the method 90 will take corrective action when the height difference is greater than 30 percent of the second height of the second die group. At step 903, in response to the determined height or thickness difference, the method 90 further includes providing a carrier substrate that is substantially free of electronic devices. In an embodiment, the carrier substrate is a blank silicon substrate. The carrier substrate can be formed using a fabrication process as shown in FIG. 7. At step 904, the method 90 includes thinning the carrier substrate to obtain a thinned carrier substrate having a third height or thickness based on the determined height difference. At step 905, the method 90 includes mounting the thinned carrier substrate to an upper surface of the first die group in order to adjust the height or thickness of the first die group with a height range of the second die group. In an embodiment, the method 90 includes removing a surface portion of the carrier substrate, such that the sum of the first height of the first die group and the third height of the thinned carrier substrate is equal to or greater than the second height of the second die group. Referring to FIG. 6. in some embodiments, the sum of the third height 604T and the first height 501T is within 30% of the second height 501T.

Referring back to FIG. 6, in some embodiments, the mold compound 530 has a thermal expansion coefficient that is different from the material properties of the package substrate 500, the first die group 501, and the second die group 502. Furthermore, the package die 50 can operate with a wide range of operational temperature, e.g., from −40 degrees C. to +150 degrees C. The wide range of temperature can cause thermal stress to the package die 50. The material properties of the package substrate, the dielectric layers, electrically conductive layers, the carrier substrate, and the mold compound have coefficients of thermal expansion (CTE) that vary substantially with temperatures. For example, the CTE of silicon is about $2.5 \cdot 10^{-6}$/K (2.5 ppm/° C.) at 20 degrees C., the CTE of copper is about 14 to 19 ppm/° C. at 20 degrees C., the CTE of dielectric is about 0.5 to 8 ppm/° C. at 20 degrees C. The overall CTE of the die groups can be about 2 to about 10 ppm/° C. at 20 degrees C. The CTE of the mold compound can vary more than two orders of magnitude over the temperature −40 degrees C. to +150 degrees C. The large difference in CTEs between the carry substrate and the mold compound can cause warpage to the die groups. As a result, embodiments further provide a stress relief feature that can reduce or eliminate this thermal stress. In an embodiment, the mold compound 530 includes at least one cavity or void disposed between the first and second die groups.

Figure 10:
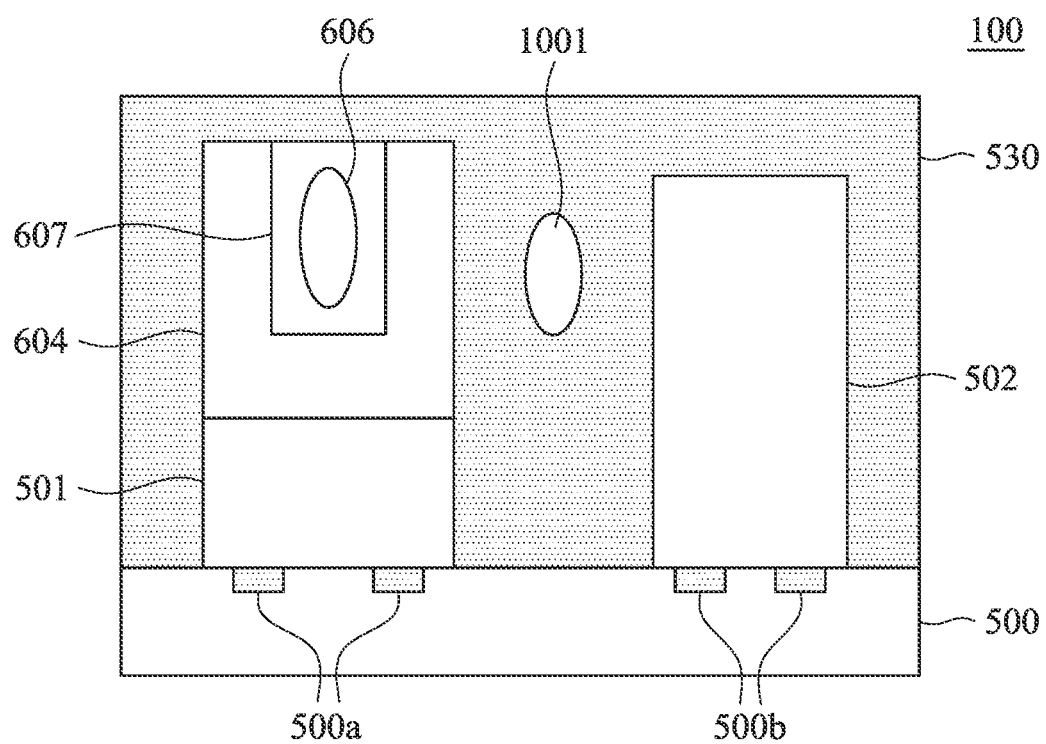
FIG. 10 is a simplified cross-sectional view illustrating a package device according to an embodiment.

FIG. 10 is a cross-sectional view illustrating a package device 100 according to an embodiment. The package device 100 is similar to the package device 60 with the difference that the package device 100 further includes at least one void or cavity in a molding compound region between the first and second die groups. Referring to FIG. 10, the stress relief feature further includes at least one cavity or void 1001 disposed between the first and second die groups. In an embodiment, the dimensions of the cavity or void 1001 can be adjusted based on the thickness or height difference between the first and second die groups. In an embodiment, the dimensions of the cavity or void 1001 can be adjusted according to the CTE difference between the first and second die groups. In an embodiment, the thickness or height difference between the first and second die groups is about 30 percent or less of the second die group. In an embodiment, the first die group is a system-on-integrated circuit (SoIC), and the second die group is a high bandwidth memory (HBM) device. In an embodiment, the CTE of the first die group is about 2 ppm/° C. to about 10 ppm/° C., and the CTE of the second die group is about 3 ppm/° C. to about 15 ppm/° C.

In an embodiment, the mold compound includes a high viscosity material, which is deposited on the substrate, the first and second die groups by a spin-coating process. The mold compound may include a molding material having a viscosity higher than the viscosity of deionized water and can be formed by a spin coating process with a relative high rotation speed, e.g., in a range between 1000 rpm and 7000 rpm. The spin coating process at high speed results in voids that are formed between the first and second die groups. In some embodiments, the rotation speed of the spin coating is controlled or adjusted to obtain a target density and size of voids in the mold compound, thereby reducing thermal stress of dies having mismatched CTEs in the package device. In some embodiment, the mold compound can include organic polymers, ceramics, glasses, plastics, and others.

Figure 11:
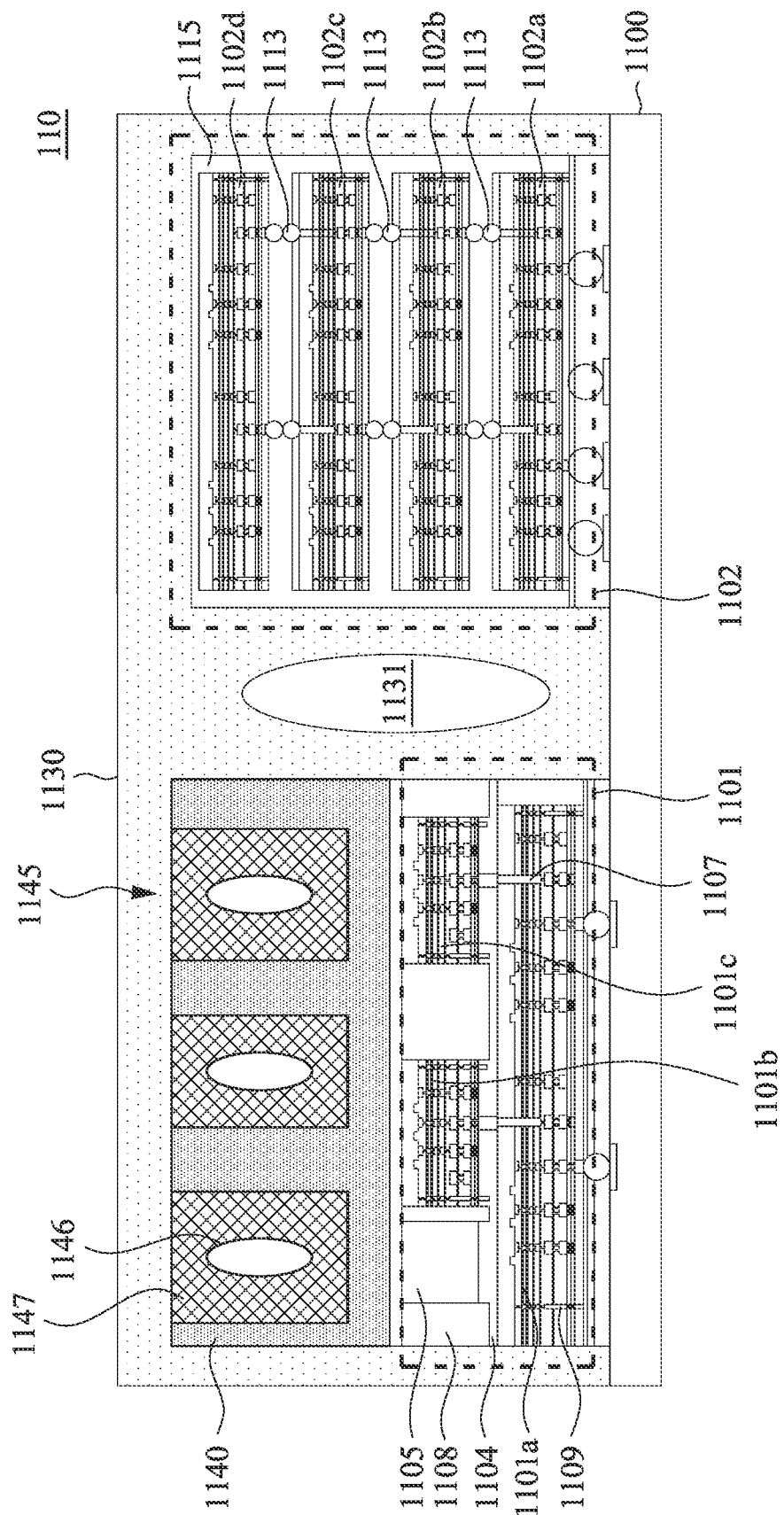
FIG. 11 is a simplified cross-sectional view illustrating a package device having a stress relief structure according to an embodiment.

FIG. 11 is a cross-sectional view illustrating a package device 110 having a stress relief structure according to an embodiment. The package device 110 is similar to the package device 100 of FIG. 10 with the difference that more detailed arrangements and elements (e.g., hybrid bonding of dies in a first die group, fusion bonding between a carrier substrate and the first die group, metal-to-metal bonding and molding packaging structure of the second die group) are shown. Referring to FIG. 11, the package device 110 includes a first die group 1101 and a second die group 1102 flip-chip bonded to a substrate 1100. In an embodiment, the first die group 1101 and the second die group 1102 each include bumps configured to be bonded to the substrate 1100. The bumps may be solder balls, conductive bumps, ball grid arrays, or the like.

The first die group 1101 may be similar to the die group 30 of FIG. 3C or die group 501 of FIG. 5B, and the second die group 1102 may be similar to the die group 40 of FIG. 4 or die group 502 of FIG. 5C. In an embodiment, the first die group 1101 includes a first die 1101a disposed in a first plane level, a second die 1101b, and a third die 1101c disposed in a second plane level, where the second and third dies are hybrid bonded to the first die 1101a by a metal-to-metal bonding through the through-substrate vias 1107 and oxide-to-oxide (dielectric) layer 1104 bonding at a temperature from about 100° C. to 200° C. and a pressure in a range from about 0.7 bar to about 10 bar. In some embodiments, a dummy layer 1105 is disposed in the second plane level and configured to provide mechanical stability to the second plane level when the second plane level does not have sufficient die density. The first die group 1101 also includes an around die dielectric layer (e.g., TEOS, SiO2) 1108 surrounding the first die 1101a in the first plane level and the second and third dies 1101b, 1101c in the second plane level. The first die group 1101 also includes a seal ring 1109 surrounding each of the first, second and third dies 1101a, 1101b, and 1101c and configured to prevent moisture from entering the dies.

In an embodiment, the second die group 1102 includes a first die 1102a, a second die 1102b, a third die 1102c, and a fourth die 1102d bonded to each other through conductive bonding structures 1112. In an embodiment, the first, second, third, and fourth dies are electrically and mechanically connected to a plurality of conductive bonding structures 1113. The second die group 1102 also includes a molding compound layer 1115 that encapsulates the dies 1110a through 1110d and fills air gaps between the dies.

The first die group 1101 and the second die group 1102 may have different heights (thickness) and CTEs. When the first die group and the second die group are encapsulated in a molding compound, the height difference between the first and second die groups may induce uneven top stress to the die group that has a smaller height. The present inventor discovered that molding stress can cause warpage and delamination of the first die group when the height difference is greater than a certain percentage height range of the second die group. The present inventor provided herein a solution by mounting a carrier substrate 1140 on an upper surface of the first die group 1101 to compensate for the height difference, thereby reducing the uneven top stress of the first die group.

Referring to FIG. 11, the carrier substrate 1140 includes a silicon substrate having at least one trench 1145, a dielectric material 1147 in the trench, and at least air gap 1146 completely encapsulated in the dielectric material 1147. In an embodiment, the carrier substrate 1140 has a height or thickness that is characterized by a height or thickness difference between the first and second die groups. In an embodiment, the first die group has a first thickness, the second die group has a second thickness, and the sum of the thickness of the carrier substrate and the first thickness of the first die group is equal to or greater than the thickness of the second die group. The carrier substrate 1140 and the first die group 1101 are fusion bonded together. In some embodiments, the carrier substrate 1140 may include a glass substrate, quartz, resin, silicon substrate. In some embodiments, the carrier substrate 1140 may be attached to a top surface of the first passivation layer using an adhesion layer. The carrier substrate can relieve mechanical and thermal stress applied to the first die group. The carrier substrate can support the die group from being warped. A fabrication process of the carrier substrate including the encapsulated air gap and the thickness adjustment has been described with reference to FIGS. 7 through 9, so that a detailed description is omitted herein for the sake of brevity.

Referring still to FIG. 11, the package device 110 also includes an encapsulating layer 1130 on the substrate 1100 and covering the first die group 1101 and the second die group 1102. The encapsulating layer 1130 includes a cavity 1131 disposed in a encapsulating region between the first and second die groups and configured to compensate for the CTE mismatch of the first and second die groups. In an embodiment, the dimensions of the cavity 1301 can be adjusted according to the CTE difference between the first and second die groups. In an embodiment, the encapsulating layer 1130 may include a molding material similar to the mold compound 530 A described with reference to FIG. 5A. In an embodiment, the encapsulating layer 1130 may include organic polymers, ceramics, glasses, plastics that have a viscosity higher than the viscosity of deionized water. In an embodiment, the cavity 1131 can be formed by a spin coating process with a relative high rotation speed resulting in voids that are formed between the first and second die groups. In some embodiments, the rotation speed of the spin coating is controlled or adjusted to obtain a target density and size of voids in the mold compound, thereby reducing thermal stress of dies having mismatched CTEs in the package device 110.

Embodiments of the present disclosure provide a package device having a stress relief feature for reducing thermal stress of the package device. In an embodiment, the package includes a substrate, a first die group bonded to the substrate, a carrier substrate attached to the first die group and containing at least one air gap, and a second die group spaced apart from the first die group and bonded to the substrate.

Embodiments of the present disclosure provide a semiconductor device. The semiconductor device includes a package substrate, a first die group bonded onto the package substrate and characterized by a first thickness, a second die group bonded onto the package substrate and characterized by a second thickness, and a carrier substrate on the first die group and characterized by a third thickness that is a function of a difference between the first thickness and the second thickness.

Embodiments of the present disclosure also provide a method of forming a package device. The method includes providing a first die group and a second die group, determining a height difference between the first die group and the second die group, providing a carrier substrate in response to the determined height difference, the carrier substrate being substantially free of electronic devices, thinning the carrier substrate based on the height difference to obtain a thinned carrier substrate, and mounting the thinned carrier substrate to the first die group to form a height-adjusted first die group having a height within a height range of the second die group.

The foregoing merely outlines features of embodiments of the disclosure. Various modifications and alternatives to the described embodiments will be apparent to those skilled in the art in view of the teachings herein. Those skilled in the art will appreciate that equivalent constructions do not depart from the scope of the present disclosure, and that they may make various changes, substitutions, and alterations herein without departing from the spirit and scope of the present disclosure.

What is claimed is:

1. A package comprising from bottom to top:
   a package substrate;
   a first die group having an upper surface and a lower surface opposite to each other and comprising a first plurality of dies, the lower surface of the first die group being directly bonded to the package substrate and characterized by a first thickness;
   a carrier substrate without any active electronic devices formed thereon and attached to the upper surface of the first die group and comprising at least one air gap within the carrier substrate, wherein the carrier substrate is characterized by a third thickness; and
   a second die group comprising a second set of one or more dies, the second die group being horizontally distal and distinct from the first die group and directly bonded to the package substrate and characterized by a second thickness; and,
   wherein a sum of the first thickness and the third thickness is equal to or greater than the second thickness.

2. The package of claim 1, wherein the second die group comprises:
   a plurality of dies stacked on top of each other and encapsulated by a molding compound material.

3. The package of claim 1, wherein the third thickness of the carrier substrate is characterized by a difference between the first thickness of the first die group and the second thickness of the second die group.

4. The package of claim 1, wherein the carrier substrate comprises at least one trench filled with a dielectric material, and the at least one air gap is completely encapsulated in the dielectric material.

5. The package of claim 1, wherein the sum of the first thickness and the third thickness is greater than the second thickness.

6. The package of claim 5, wherein the sum of the first thickness and the third thickness is within 30% of the second thickness.

7. The package of claim 4, wherein the at least one air gap is completely encapsulated in the dielectric material to prevent residual moisture or pollutant from entering the at least one air gap.

8. The package of claim 4, wherein the dielectric material comprises a low-k dielectric material.

9. The package of claim 4, wherein the at least one air gap includes air.

10. The package of claim 4, wherein the at least one air gap includes vacuum.

11. The package of claim 1, wherein a lower surface of the carrier substrate is planarized.

12. A semiconductor device comprising from bottom to top:
   a package substrate;
   a first die group having an upper surface and a lower surface opposite to each other and comprising a first plurality of dies, wherein the lower surface of the first die group is directly bonded onto the package substrate, the first die group characterized by a first thickness;
   a second die group horizontally distal from the first die group and directly bonded onto the package substrate, the second die group characterized by a second thickness;
   a carrier substrate without any active electronic devices formed thereon and attached to the upper surface of the first die group and characterized by a third thickness that is a function of a difference between the first thickness and the second thickness, wherein the carrier substrate comprises a trench, a dielectric material in the trench, and an air gap encapsulated in the dielectric material; and
   a molding compound material on the package substrate and covering the first die group and the second die group.

13. The semiconductor device of claim 12, wherein a sum of the third thickness and the first thickness is within 30% of the second thickness.

14. The semiconductor device of claim 12, wherein a sum of the first thickness and the third thickness is equal to or greater than the second thickness.

15. A semiconductor package comprising from bottom to top:
   a package substrate;
   a first die group having an upper surface and a lower surface opposite to each other and comprising a first plurality of dies, wherein the first die group is characterized by a first thickness, and the lower surface of the first die group is directly bonded to the package substrate;
   a second die group comprising a second set of one or more dies, wherein the second die group is characterized by a second thickness larger than the first thickness, and the second die group is horizontally distal from the first die group and directly bonded to the package substrate; and
   a carrier substrate without any active electronic devices formed thereon and encapsulating at least one air gap, wherein a lower surface of the carrier substrate is attached to the upper surface of the first die group, and the carrier substrate is characterized by a third thickness equal to or greater than a difference between the second thickness and the first thickness.

16. The semiconductor package of claim 15, wherein the third thickness is equal to the difference between the second thickness and the first thickness.

17. The semiconductor package of claim 15, wherein the third thickness is greater than the difference between the second thickness and the first thickness.

18. The semiconductor package of claim 15, wherein the at least one air gap is completely encapsulated in a dielectric material to prevent residual moisture or pollutant from entering the at least one air gap.

19. The semiconductor package of claim 15, wherein the carrier substrate comprises at least one trench filled with a dielectric material, and the at least one air gap is completely encapsulated in the dielectric material.

20. The semiconductor package of claim 19, wherein the dielectric material comprises a low-k dielectric material.

\* \* \* \* \*